(12) United States Patent
Suresh et al.

(10) Patent No.: US 10,911,063 B2
(45) Date of Patent: Feb. 2, 2021

(54) ADAPTIVE SPECULATIVE DECODING

(71) Applicant: Intel Corporation, Santa Clara, CA (US)

(72) Inventors: Vikram B. Suresh, Portland, OR (US); Sudhir K. Satpathy, Hillsboro, OR (US); Sanu K. Mathew, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/592,465

(22) Filed: Oct. 3, 2019

(65) Prior Publication Data
US 2020/0036389 A1 Jan. 30, 2020

(51) Int. Cl.
*H03M 7/30* (2006.01)
*H03M 7/42* (2006.01)

(52) U.S. Cl.
CPC ......... *H03M 7/3086* (2013.01); *H03M 7/425* (2013.01)

(58) Field of Classification Search
CPC .. H03M 7/425; H03M 7/3086; H03M 7/4081; H03M 7/6005; H03M 7/6023
USPC .............................................. 341/51, 65, 67
See application file for complete search history.

(56) References Cited

U.S. PATENT DOCUMENTS

| | | | |
|---|---|---|---|
| 6,043,765 A | 3/2000 | Twardowski | |
| 9,484,954 B1* | 11/2016 | Gopal | H03M 7/3086 |
| 9,825,647 B1* | 11/2017 | Satpathy | H03M 7/3082 |
| 9,825,649 B1* | 11/2017 | Satpathy | H03M 7/4006 |
| 2002/0036389 A1* | 3/2002 | Thir | B62M 5/00 280/253 |
| 2019/0387231 A1* | 12/2019 | Coban | H04N 19/12 |
| 2019/0387259 A1* | 12/2019 | Coban | H04N 19/184 |
| 2020/0007873 A1* | 1/2020 | Coban | H04N 19/91 |
| 2020/0099404 A1* | 3/2020 | Avraham | H03M 13/3927 |

OTHER PUBLICATIONS

Drijvert, Tim, et al., "Fast Huffman Decoding by Exploiting Data Level Parallelism", Department of Electrical Engineering Eindhoven University of Technology, The Netherlands, Silicon Hive, Eindhoven, The Netherlands, 2010 IEEE, 7 pages.

Huffman, David A., Associate, IRE, A Method for the Construction of Minimum-Redundancy Codes, Proceedings of the I.R.E., Sep. 1952, 4 pages.

* cited by examiner

*Primary Examiner* — Lam T Mai
(74) *Attorney, Agent, or Firm* — Compass IP Law PC

(57) ABSTRACT

Examples herein relate to decoding tokens using speculative decoding operations to decode tokens at an offset from a token decoded by a sequential decoding operation. At a checkpoint, a determination is made as to whether tokens to be decoded by the sequential and speculative decoding operations align. If there is alignment, the speculatively decoded tokens after a discard window are committed and made available for access. If there is not alignment, the speculatively decoded tokens are discarded. A miss in alignment and a fullness level of a buffer that stores speculatively decoded tokens are assessed to determine a next offset level for a start of speculative decoding. A size of a discard window can be set using a relationship based on the offset level to improve buffer utilization and to attempt to improve changes of alignments.

26 Claims, 13 Drawing Sheets

| LUT of decoding parameters ||
|---|---|
| Offset value | Discard Window |
| 10 | 10 |
| ⋮ ||
| 40 | 600 |
| 42 | 615 |

FIG. 7B

ADAPTIVE SPECULATIVE DECODING

TECHNICAL FIELD

Various examples described herein relate to compression and de-compression techniques.

BACKGROUND

Data can be compressed using a lossless or lossy compression algorithms to reduce the amount of data used to store or transmit digital content. Lossless compression algorithms reconstruct the original message exactly from the compressed representation. By contrast, lossy compression algorithms can reconstruct the original message but with lost data or reduced quality. Lossless data compression algorithms include Lempel-Ziv (LZ) algorithms such as LZ77 and LZ4. Applications that perform file compression and decompression and that can use LZ lossless data compression algorithms include GNU zip (gzip), GIF (Graphics Interchange Format) and Zstandard.

BRIEF DESCRIPTION OF THE DRAWINGS

FIG. 7B depicts an example look-up table.

DETAILED DESCRIPTION

Huffman encoding and decoding are manners of lossless data compression. A Huffman-encoded output can be determined using a variable-length code translation table. Speculative Huffman decoding breaks the conventional serial bottleneck imposed by variable length codes of a compressed payload by enabling out-of-order code decompression. Significant single-thread performance improvements can be achieved using out-of-order code decompression. Out-of-order code decompression is applicable to many standard algorithms including DEFLATE, Broth, Xpress, and Zstandard where Huffman entropy encoding is leveraged at various stages to maximally compress data.

For out-of-order code decompression, a speculative thread is launched to decode symbols at an offset from a code decoded by a concurrently progressing in-order code decompression thread. Out-of-order code decompression processes a part of the payload in advance. After discarding a pre-defined number of symbols, decompressed symbols are checkpointed and subsequently committed after successful convergence of both the speculative thread and the in-order symbol decompression thread.

Out-of-order decompression using a speculative (out-of-order) thread uses fixed parameters that are carefully selected after running performance benchmarks to define the offset of speculative thread from the real thread and the number of discarded symbols for a given speculative symbol offset. A static set of speculation parameters limits achievable single-thread performance. Within a standard test-suite, different test files use unique parameter settings to maximize performance with rigorous regression runs and significant test duration to converge on a common set of parameters. For example, configuring the system for performance on one test-suite (e.g., Calgary) does not necessarily guarantee best performance on a different test-suite (e.g., Silesia) or real workloads. The strong dependency of these speculation parameters and system configuration on data type can render this approach sub-optimal for generic big data applications with widely varying workloads. Moreover, this approach may involve design tweaks to address worst-case performance and lead to design overheads in terms of extra intermediate storage use and additional speculation threads because of synthetic test-cases that are very rarely encountered in real workloads.

Figure 1:
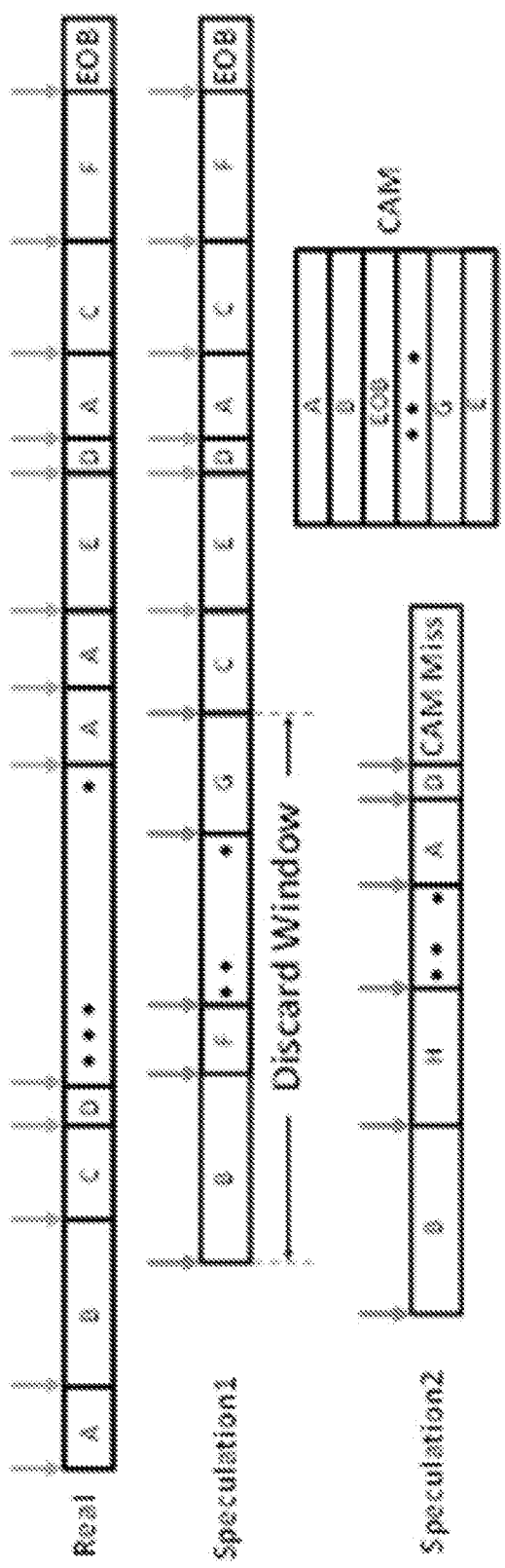
FIG. 1 depicts a speculative decompression scheme.

FIG. 1 depicts a speculative decompression scheme. In this example, a compressed payload includes Huffman encoded symbols (e.g., tokens or codes) with lengths varying from 1 byte to 15 bytes. Speculative Huffman decoding can make it possible to decode a compressed stream at any arbitrary offset from another decoding. In a conventional scheme, the speculative decoder thread is launched at a pre-defined offset from a beginning symbol decoded by an in-order decoder thread (e.g., "real" thread). The speculative decoder thread progressively decodes the payload using a content addressable memory (CAM) that stores Huffman codes also used by the in-order decoder thread to decode symbols. Note that a thread can be run a process run on one or more cores.

The serial dependency among consecutive Huffman codes (of potentially varying lengths) creates a performance bottleneck and applies decode of prior symbols from the beginning before attempting to decode the next symbol in a compressed stream as the position of a code is not known until the serially prior code is decoded. For example, the in-order decoder thread can serially decode token A, then token B, then token C, and so forth. A token can be an encoded value of a symbol and symbol lengths are the same but token lengths can vary. The end of a token is not known until the token is decoded using Huffman codes. Accordingly, it is extremely challenging to identify the starting position of a symbol using any arbitrary index.

However, unlike the in-order decoder thread, the speculative thread generates incorrect symbols in the beginning that are discarded. The number of symbols that are discarded is defined as a "discard window." Use of a discard window can increase a chance of selecting a starting point for an actual token and decoding the token. The converging nature of Huffman codes self-synchronizes the speculative decoder thread, thereby resulting in eventual generation of correct symbols. The success of this approach uses a value of the discard window that is larger than the number of initial incorrect symbols generated by the speculative decoder thread. Situations of a CAM miss, where no encoded symbol match is found, can be treated as mis-speculation place and trigger a rollback that flushes speculative symbols and relaunches a new speculative thread.

Figure 2:
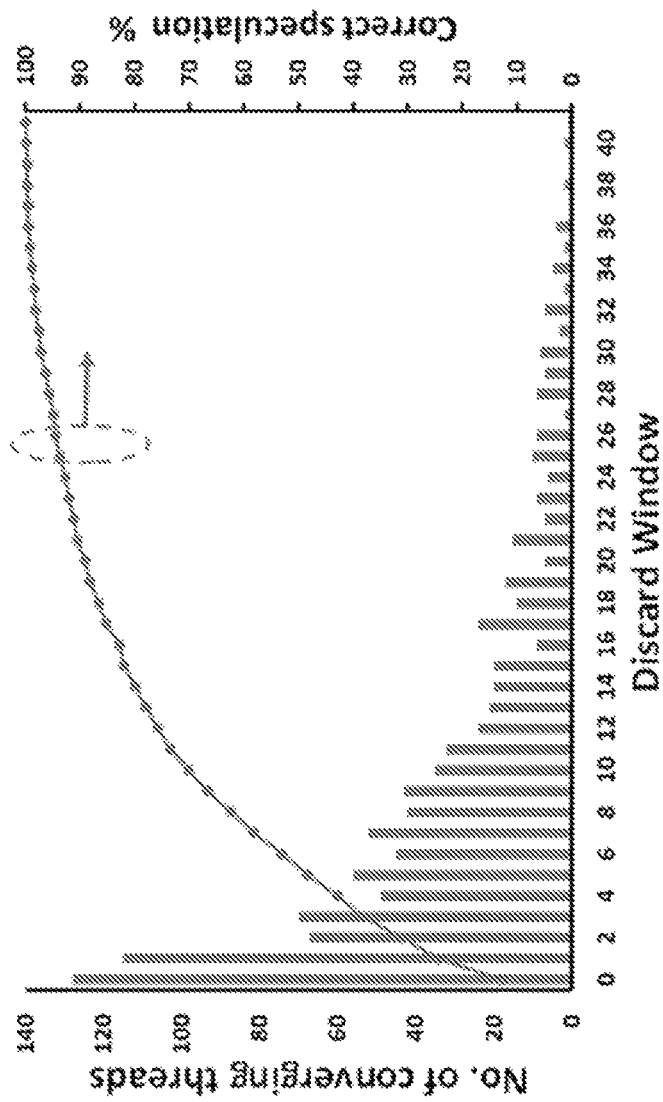
FIG. 2 depicts thread convergence at different convergence windows.

FIG. 2 depicts thread convergence at different discard windows. The bar diagram shows the number of threads that converge at a particular discard window. In this example, a success rate of over 99% can be achieved with a discard window of 40 symbols as measured from test files provided in the industry standard compression corpus. Although, a larger discard window increases the probability of convergence success, it limits performance improvement by throwing away correct symbols decoded in the speculative thread.

Figure 3:
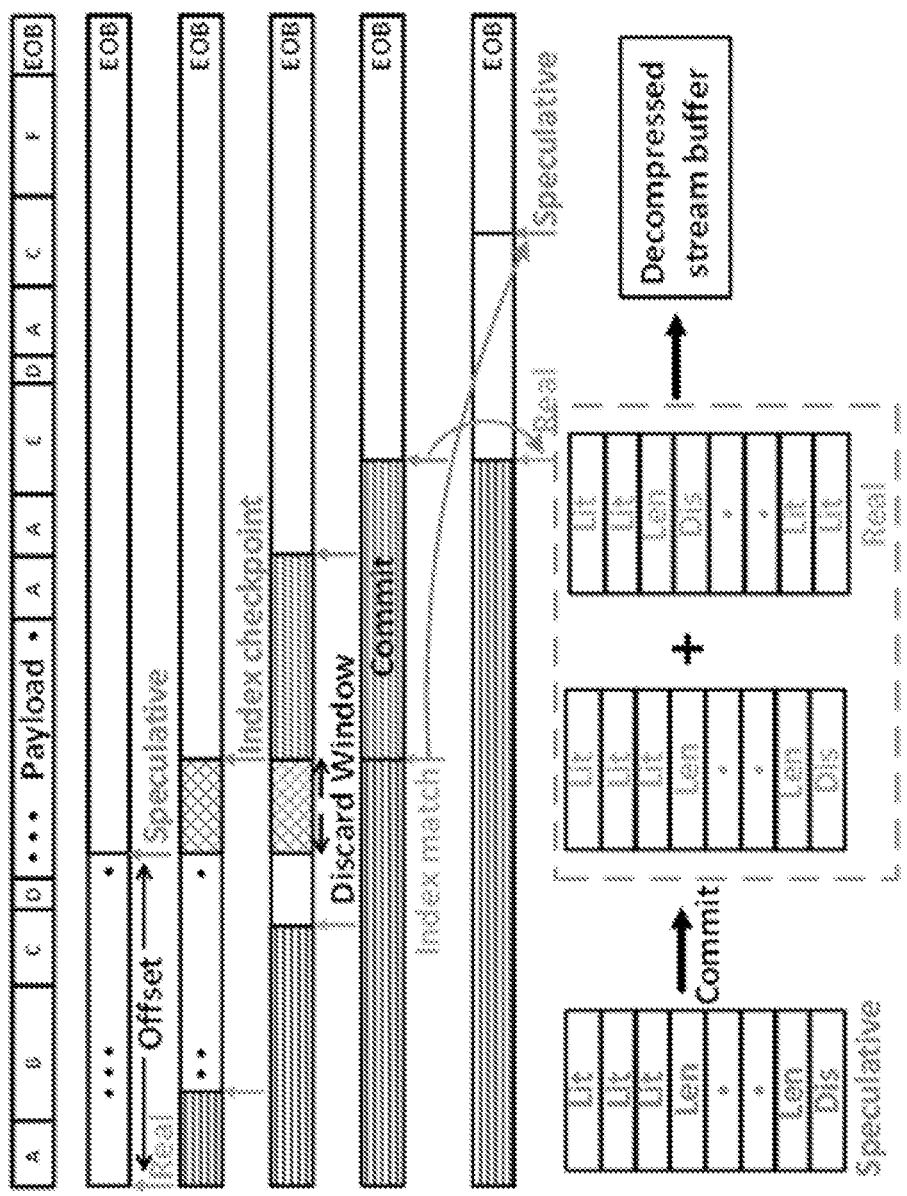
FIG. 3 shows the offset between the in-order decoding threads and speculative threads and a mechanism of thread convergence by index check-pointing.

FIG. 3 shows offset between the in-order decoding threads and speculative threads and a manner of thread convergence by index check-pointing. A parameter that affects overall decompression performance is the offset between starting point symbols decoded using the in-order decoding and speculative threads. A smaller offset uses lesser additional logic (e.g., memory space) to store speculative symbols. A longer offset, however, incurs more area overhead (e.g., more memory space), but amortizes the overhead of discarded symbols across a larger number of speculatively decoded symbols. Increasing the number of speculative threads, for a given offset may result in a higher number of discarded symbols because of speculative threads not converging, reducing overall decode efficiency.

The in-order (sequential) decoding thread progressively decodes the payload from its beginning and compares its index with an index checkpoint. The index checkpoint is placed in a bitstream of tokens after a discard window ends at which a check is made as to whether a token boundary (e.g., location of token start or token ending) completed by in-order decoding matches a token boundary completed by speculative decoding. A token boundary completed by in-order decoding matching a token boundary completed by speculative decoding indicates successful convergence, leading to a commit of speculatively decoded symbols outside of the discard window. Committed speculatively decoded symbols can be available for use or access from a decompressed stream buffer by an application or device or subsequent processing. The sequential thread decodes symbols up to the index checkpoint. If the sequential thread pointer matches the index checkpoint, the speculative decode is a success and symbols decoded by the speculative thread up to the index checkpoint are committed as successfully decoded symbols and available for further use.

In some examples where a decoded token is a Lempel-Ziv LZ77 symbol, string repetitions in the raw stream are identified and replaced with references. A reference consists of a length and a distance symbol. The length tells how big the reference is and the distance indicates how far back to should go to fetch the reference. The LZ77 step generates a stream of literals (e.g., American Standard Code for Information Interchange (ASCII) characters), length and distances that are represented with 8 bits.

The speculative thread checkpoints a bit index after a discard window. If there is an index match, the two threads swap roles whereby the speculative thread becomes the sequential (real) thread and the sequential thread launches a new speculative decode thread with an offset from the newly formed real thread pointer.

Figure 4:
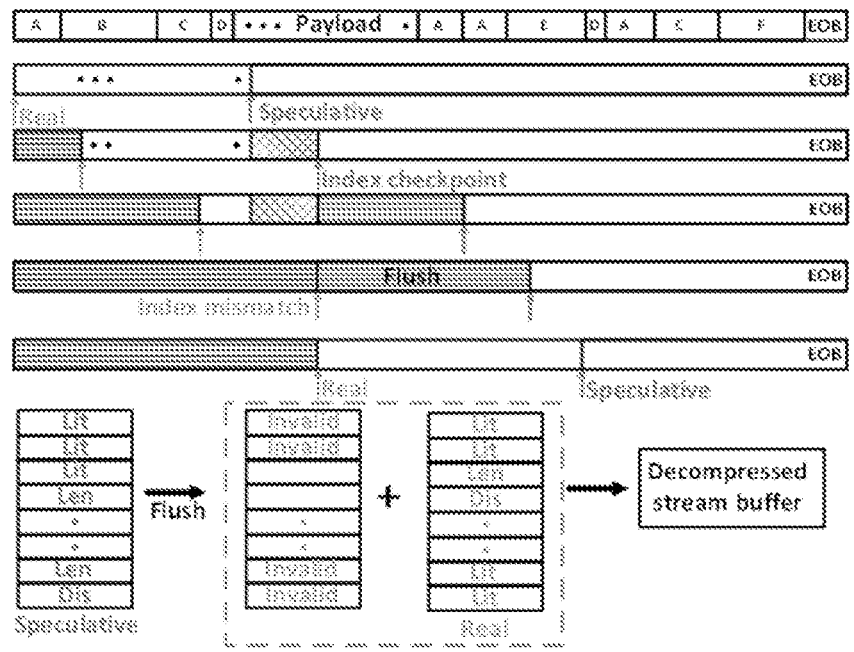
FIG. 4 shows a scenario of convergence failure, wherein speculative symbols are flushed and a new speculation thread is launched.

FIG. 4 shows a scenario of convergence failure, wherein speculative symbols are flushed and a new speculative thread is launched. In this example, at the index checkpoint, a token boundary used by the in-order decoding does not match a token boundary determined by speculative decoding. Speculatively decoded tokens are discarded. A flush window can represent decoded symbols that were either committed or discarded. The in-order decoding can continue from the index checkpoint and the speculative thread commences to decode a token at an offset from the index checkpoint.

The number of speculative symbols generated prior to convergence also depends on the nature of the compressed payload. Payloads compressed at higher efficiency tend to have smaller codes, and hence generate more symbols than poorly compressed payloads for the same offset. This further exacerbates the performance limitation imposed by static set speculation parameters. For example, a well compressed payload can fill up the storage buffer with symbols and stall the speculative thread until the next convergence event as the speculative thread cannot continue to decode tokens if its output buffer is considered "full." To address these limitations and enable decompression accelerators to leverage Huffman speculation, various embodiments provide an adaptive approach that continuously adjusts the speculative offset and discard window parameters in response to changing workloads to tune the speculative decode for improved performance.

Various embodiments provide an adaptive approach to speculative token decompression for entropy encoded content. For example, entry encoded content can be encoded using variable length codes of Huffman type encoding. Some embodiments monitor utilization of an intermediate buffer that stores speculatively decoded tokens to estimate a total number of symbols that were generated by the speculative thread before convergence of a beginning of a token decoded using the in-order decoder thread with a beginning of a token decoded using the speculative thread. To improve buffer utilization, the speculative offset is adjusted based on buffer fullness level. For example, the speculative offset can be decreased if the buffer is considered full. The speculative offset can be increased if the buffer was not considered full. A look-up-table (LUT) can be used to select a discard window (e.g., initial number of speculative symbols to discard before a check-point) corresponding to the determined speculative offset. Accordingly, a discard window size can be adjusted to improve speculative decode performance for changing workloads and in real time.

The rate at which the speculative thread decodes symbols depends on the workload and how well it is compressed. The utilization of the speculative buffer is a direct indication of how many symbols were decoded by the speculative thread before the sequential (real) thread catches up. If the buffer is not full or close to being full, the buffer is underutilized and increasing the offset can allow the buffer to fill more and the sequential (real) thread will take longer to catch up with the speculative thread and more symbols can be decoded by the speculative thread.

Various embodiments monitor the utilization of an intermediate buffer that stores speculatively decoded tokens to estimate a total number of symbols that were generated by the speculative thread before convergence with an in-order thread. To increase buffer utilization, the speculation offset is adjusted appropriately (e.g., decrement offset if buffer was full or increment otherwise). A look-up-table (LUT) generated a priori selects a suitable discard window (e.g., initial number of speculative symbols to discard before the checkpoint) corresponding to the offset to improve single thread performance.

If a size of a buffer used to store speculatively decoded symbols is small relative to the offset value, the speculative thread will run out of buffer space before the sequential (real) thread can reach the checkpoint and transfer the decoded symbols out of the buffer. As a result, the speculative thread is paused, and the performance degrades. However, if the buffer is too big relative to the offset, the sequential (real) thread always reaches checkpoint before the speculative thread fills up the buffer. Accordingly, on-chip physical memory is not utilized, and excess space can be considered a wasted resource. Various embodiments attempt to utilize available buffer space while avoiding discards of decoded symbols.

Various embodiments can enable higher decompression performance when one encoded message is decoded at a time even if one or more speculative threads are running in the background. Because of its serial nature, lossless decompression is extremely challenging to accelerate and linear improvement in performance can use exponentially larger hardware. Various embodiments can improve performance with use of a LUT that can be implemented by leveraging an existing register file or a static random access memory (SRAM) macro without redesign of intellectual property (IP) building blocks or a system. Various embodiments can be incorporated in firmware or programmable platforms such as Field Programmable Gate Arrays (FPGAs).

Figure 5:
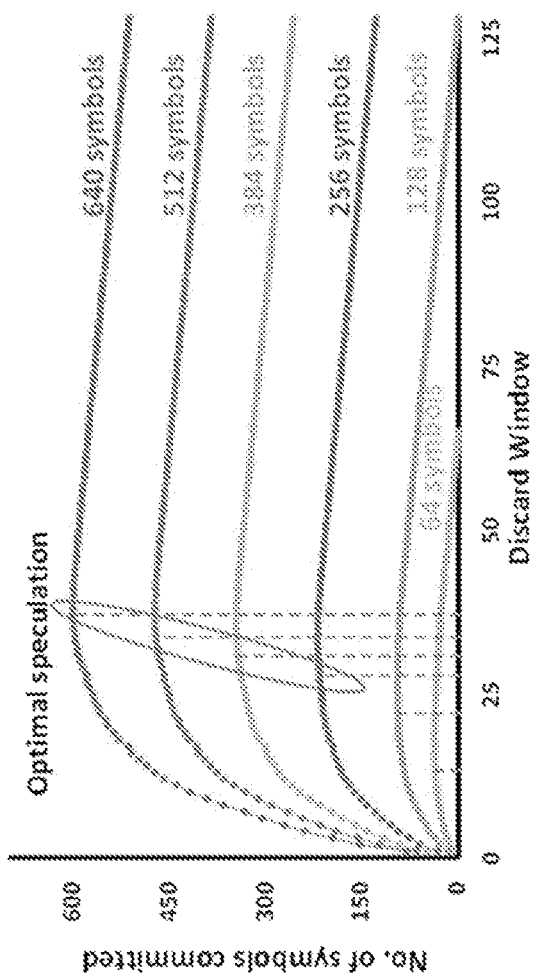
FIG. 5 depicts a speculative thread throughput for varying discard window size.

FIG. 5 depicts a speculative thread throughput for varying offset values and discard window size. Net Huffman decode throughput achieved with varying the discard window size is shown for compressed files from the compression corpus. Smaller discard windows limit performance because of a lower convergence success rate. Conversely, too large a window reduces performance by conservatively throwing away too many symbols. A desirable throughput is achieved at a discard window midway ("desired speculation"). Furthermore, the desired discard window size varies for different implementations with varying buffer sizes that store speculative symbols. From the offset versus discard-window data in FIG. 5, it was observed that an offset value has a unique discard window to achieve desired speculation throughput.

Figure 6:
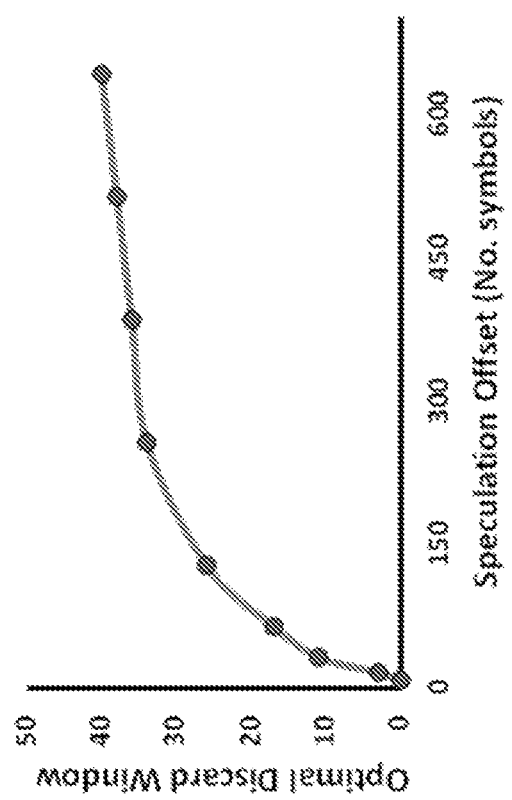
FIG. 6 depicts an example discard window for different speculation offsets.

FIG. 6 depicts an example desired discard window for different speculation offsets, which can be used for adaptive speculation. As is shown in FIG. 6, smaller buffers tend to favor smaller discard windows and vice versa.

Figure 7A:
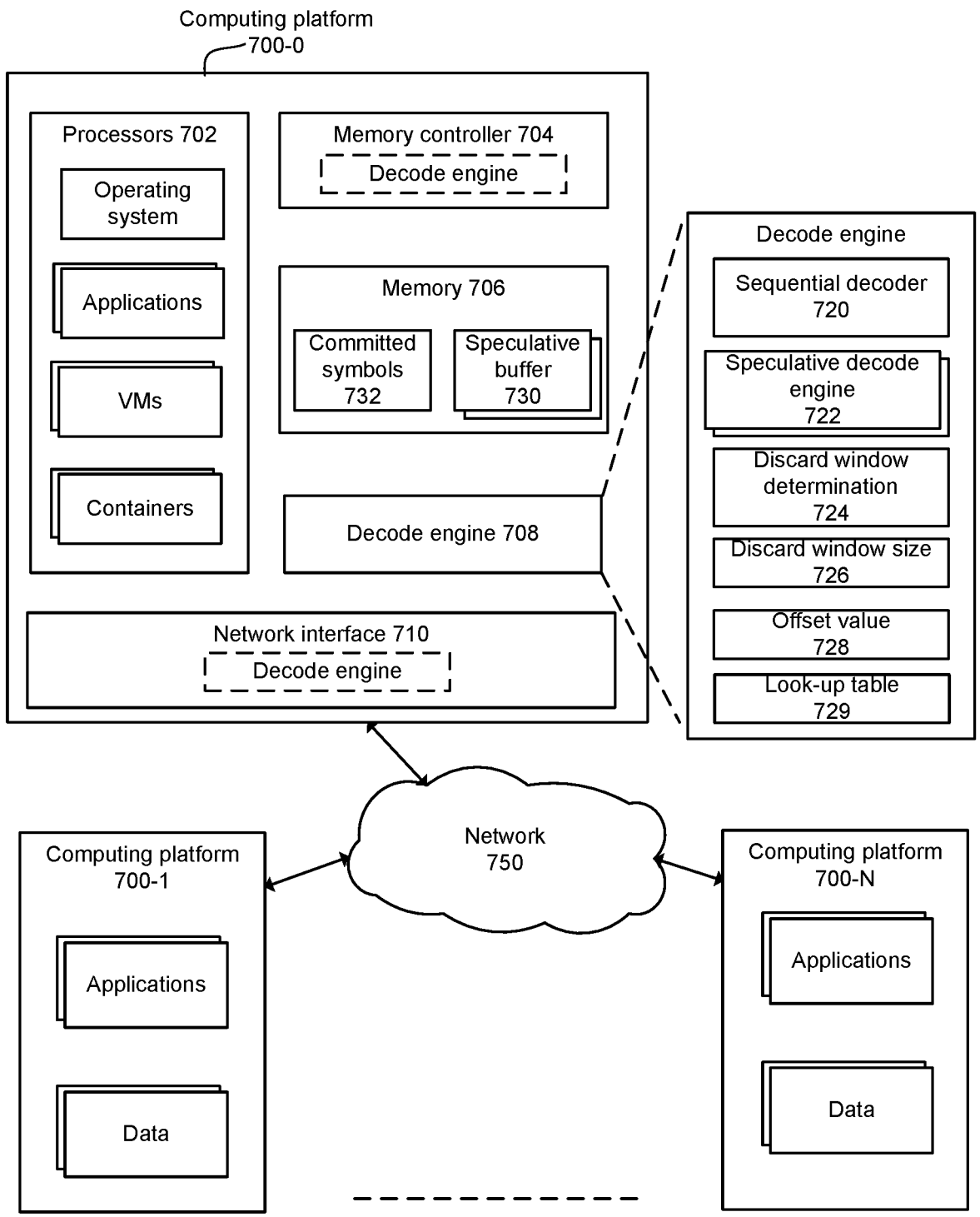
FIG. 7A depicts a system that can perform sequential and speculative decoding.

FIG. 7A depicts a system that can perform sequential and speculative decoding of entropy encoded content. In this example, computing platform 700 can represent any or all of computing platforms 700-0 to 700-N, wherein N>1. Computing platform 700-0 can use processors 702 to perform computation and execute applications, operating system, and drivers as well as virtual machine (VMs) or container environments. Processors 702 can be one or more of: central processing unit (CPU), core, graphics processing unit (GPU), general purpose graphics processing unit (GPGPU), field programmable gate array (FPGA), High-Density Deep Learning (HDDL) compute engines (or other devices configured for machine learning or inference related operations), or Visual Compute Accelerator (VCA) (or other image, audio, or video processor).

A virtual execution environment can be any environment that allows processes, operating systems, applications or other software to share computing resources (e.g., processors, networking, storage, and memory) while permitting data security and separation. A virtual execution environment can include a virtual machine and/or a container. A virtual machine can be software that runs an operating system and one or more applications. A virtual machine can be defined by specification, configuration files, virtual disk file, non-volatile random access memory (NVRAM) setting file, and the log file and is backed by the physical resources of a host computing platform. A container can be a software package of applications, configurations and dependencies so the applications run reliably on one computing environment to another. Containers can share an operating system installed on the server platform and run as isolated processes.

In some examples, decode engine 708 can be used by one or more of processor 702, memory controller 704 or network interface 710. In some examples, a decode engine 708 is included as part of an integrated circuit implementation of a processor 702, memory controller 704 or network interface 710. Decode engine 708 can use a sequential decoder 720 and at least one speculative decode engine 722.

Sequential decoder 720 can decode sequential tokens in a bitstream with LZ77 format content based on Huffman coding or other formats and store decoded tokens into memory. Various compressions schemes are supported for decode such as but not limited to Lempel Ziv (LZ) family of compression schemes including LZ77, LZ78, LZ4, Zstandard (ZSTD), DEFLATE, Broth (Google's standard), Xpress (Microsoft), ZSTD (Facebook), and Snappy standards and derivatives, among others. In some cases, lossy compression schemes can be selected. Decoding can take place using one or more lossless data compression algorithms including Lempel-Ziv (LZ) algorithms such as LZ77 and LZ4.

At a checkpoint where a token boundary completed by sequential decoder 720 matches a token boundary completed by speculative decode engine 722, after discarding decoded tokens in a discard window, decoded tokens generated by speculative decode engine 722 are committed and sequential decoder 720 can continue to decode tokens after the committed decoded tokens. Decode engine 708 can determine an applicable discard window and offset amount from a token decoded by sequential decoder 720 using a look-up-table or by computing a discard window size from an applied offset value (or vice versa).

Discard window determination 724 can determine a discard window for a determined offset. Discard window determination 724 can be implemented using a look-up-table (LUT) that can store discard window sizes for different buffer sizes. An initial pre-defined speculation offset and discard window are used. After every successful convergence at a checkpoint, decoding parameters can be adjusted or fine-tuned. In some examples, decoding parameters include one or more of: a speculation offset or a discard window.

Speculative symbol buffer utilization is adjusted by increasing or decreasing the offset to gather more or fewer symbols in the next iteration of speculative decoding. In some examples, the offset is adjusted to attempt to fill but not overfill the speculative buffer. After discard of symbols in a discard window, a determination is made as to whether the speculative buffer is considered full. For example, a speculative buffer can be considered full if a level of content stored by the buffer meets or exceeds a threshold. If the speculative buffer was considered full, the offset is reduced to prevent the speculative buffer from overfilling. If the speculative buffer was not considered full, the offset is increased to allow the speculative buffer to achieve a state considered full.

After adjusting the offset, LUT 729 is accessed to determine the discard window associated with the number of symbols corresponding to the offset. A coarse grain refinement scheme can be applied to adjust the offset by using bigger steps, and subsequently reduce the magnitude of offset adjustment as the system tunes itself closer towards desired configuration. Applied discard window and offset value can be stored in respective discard window size 726 and offset value 728.

In addition or instead of use of LUT 729, to save memory space, discard window determination 724 can perform a computation to determine discard window size based on an offset size. A relationship between offset level and discard window size can be determined and specified by a user or operator of a data center, for example. To start-off with, the relationship between offset and discard window is derived from benchmarks and other known workloads. But by monitoring the speculation performance, the desired value of discard window for a given offset can be learned by a machine learning (ML) model or artificial intelligence (AI) over time and updated to improve speculation performance.

Symbols generated from speculative decoding can be stored in speculative buffer 730 in memory 706. Symbols committed after speculative decoding can be stored in memory 706 (e.g., committed symbols 732).

If there are two or more speculative decoders (e.g., threads, replicas or instances of speculative decode engine 722), the index checking for convergence is done when the sequential decoder reaches an index point relative to token decoding by a first speculative decoder. If there is a convergence, symbols decoded by the first speculative decoder are committed and a new speculative decoder is launched from an offset of the current pointer of the second speculative decoder. The original first speculative decoder becomes the sequential decoder and a check is performed of when the index pointer of the original second speculative decoder is reached. However, if any index checkpoint does not match, the decoded symbols are discarded and the sequential (real) decoder (e.g., sequential decoder 720) for which the index pointer was checked continues as the sequential decoder.

With respect to offset and discard window size, the amount of offset for a speculative decoder can be selected independently such that the offset values and discard windows can be the same or a different amount. To start off with, multiple speculative decoders may use a predefined offset and discard window, which are adaptively changed as the workload is decoded. Separate branches can be applied for a speculative decoder to check for index pointer convergence with a sequential thread with offset adjustment being performed for a speculatively decoder independently using embodiments described herein.

For N speculative decoders, there can be N buffers (e.g., speculative buffers 730) where a buffer is allocated for speculatively decoded symbols of a speculative decoder. The size of a buffer can again be adaptively changed depending on the offset value of a speculative decoder. A larger offset value can lead to a larger allocated speculative buffer than that allocated to a smaller offset value.

Processors 702 can offload data decode operations to decode engine 708. For example, processors 702 can execute applications that decode data. Applications that perform file compression and decompression and that can use LZ lossless data compression algorithms include GNU zip (gzip), GIF (Graphics Exchange Format) and Zstandard, among others.

Memory controller 704 can receive read or write requests from processors 702 or other devices (e.g., computing platform 700-1 or 700-N) and manage at least read, program or erase operations with respect to content stored in memory 706. Memory controller 704 can use a decode engine 708 to decode data prior to storage in memory 706 or after retrieval from memory 706.

Network interface 710 can be used to transmit or receive data using network 750. Network interface 710 can use engine 708 to decode data prior to storage in memory 706. Data can be received or sent in one or more of: Ethernet frames, or communications compatible with remote direct memory access (RDMA), InfiniBand, Internet Wide Area RDMA Protocol (iWARP), quick UDP Internet Connections (QUIC), or RDMA over Converged Ethernet (RoCE). Data can be copied or stored to virtualized storage nodes using a protocol such as NVMe over Fabrics (NVMe-oF) or NVMe.

Network 750 can be compatible at least with Ethernet, PCIe, Intel QuickPath Interconnect (QPI), Intel Ultra Path Interconnect (UPI), Intel On-Chip System Fabric (IOSF), Omnipath, Compute Express Link (CXL), HyperTransport, high-speed fabric, NVLink, Advanced Microcontroller Bus Architecture (AMBA) interconnect, OpenCAPI, Gen-Z, CCIX, 3GPP Long Term Evolution (LTE) (4G), 3GPP 5G, and variations thereof.

Various embodiments of a decoder with sequential and speculative decoding can be used in a wireless base station, cloud radio access network (RAN), or as part of near memory compute (multi-chip package) or in-memory compute (in-die).

FIG. 7B depicts an example look-up table of decoding parameter entries. Example offset value and discard window pairs are shown.

Figure 8A:
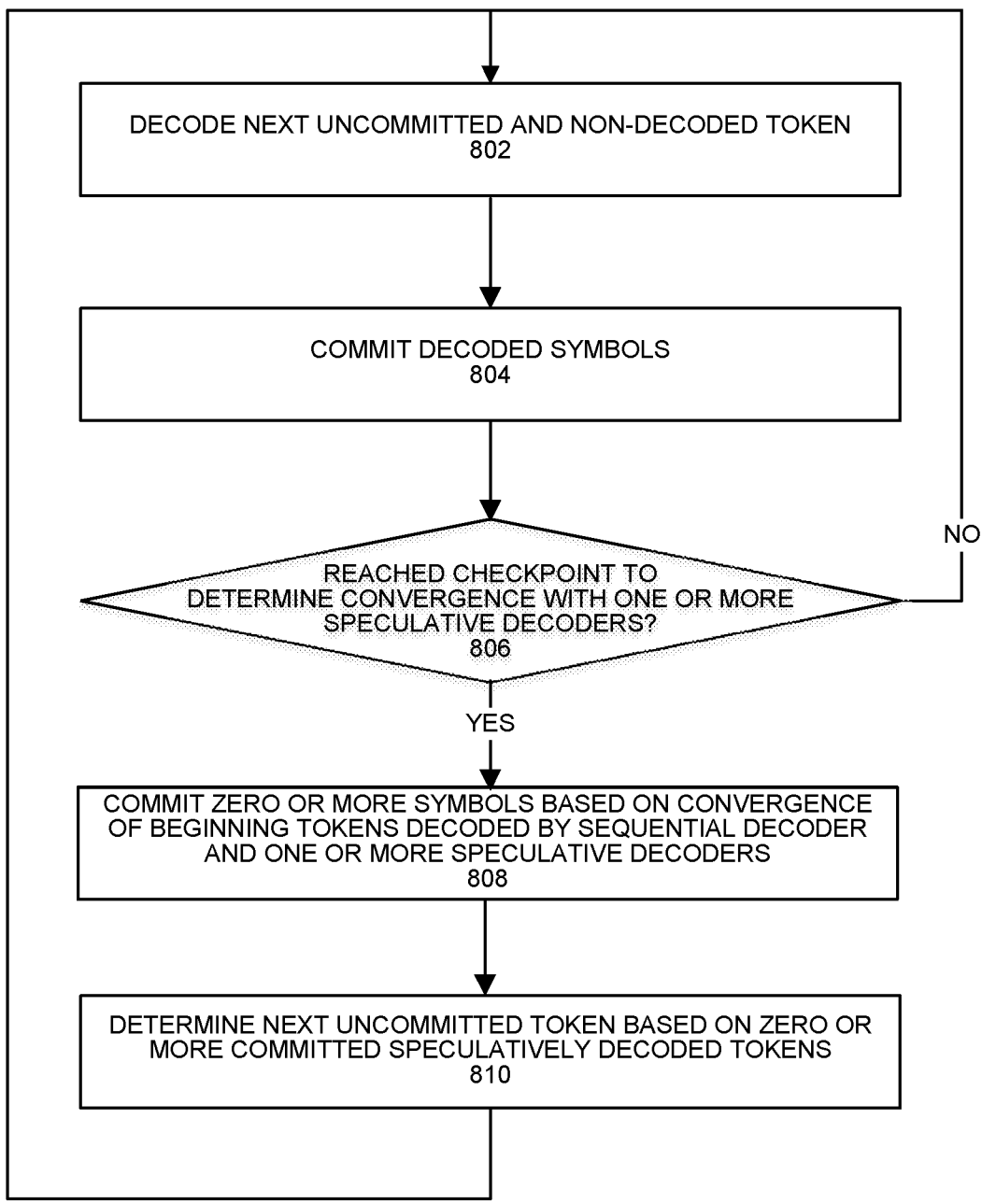
FIG. 8A depicts a process for decompression.

FIG. 8A depicts a process for decompression. The process can be performed to decode tokens in a sequential ordering of received tokens. Tokens can be encoded according to any standard including Huffman encoding, Lempel-Ziv, Arithmetic encoding, and so forth. At 802, a next uncommitted and non-decoded token is decoded. At a first iteration of 802, the next uncommitted and non-decoded token is a first token in a stream of tokens.

At 804, a decoded token is committed as a symbol. The symbol can be an LZ77 format data. A committed symbol is stored in memory and is available for further decoding or processing as data by an application or other software or device.

At 806, a determination is made if a checkpoint is reached where a convergence of the sequential decoder and one or more speculative decoders is checked. A checkpoint can be a token position or boundary in a stream such that at or after sequential decoding of the token, convergence of the sequential decoder and one or more speculative decoders is checked. If the checkpoint is reached, then the process continues to 808. If the checkpoint is not reached, the process continues to 802.

At 808, zero or more symbols are committed based on convergence of a beginning (or boundary) of a token decoded using the in-order decoder thread matching a beginning (or boundary) of a token decoded using one or more speculative decoders. If convergence is achieved, after discarding a discard window worth of symbols, symbols after the discard window are committed. Committed symbols are stored in memory and are available for further decoding or processing as data by an application or other software or device. However, if convergence is not achieved, zero symbols generated through speculative decoding are committed (i.e., symbols generated through speculative decoding are not committed). Symbols that are not committed can be discarded or overwritten.

At 810, a determination is made of a next uncommitted token based on the zero or more committed symbols. For example, if zero symbols are committed in 808, then the next uncommitted token is the next token that has not been decoded using sequential decoding. For example, if one or more symbols are committed in 808, then the next uncommitted token is the next token that has not been decoded using speculative decoding.

Figure 8B:
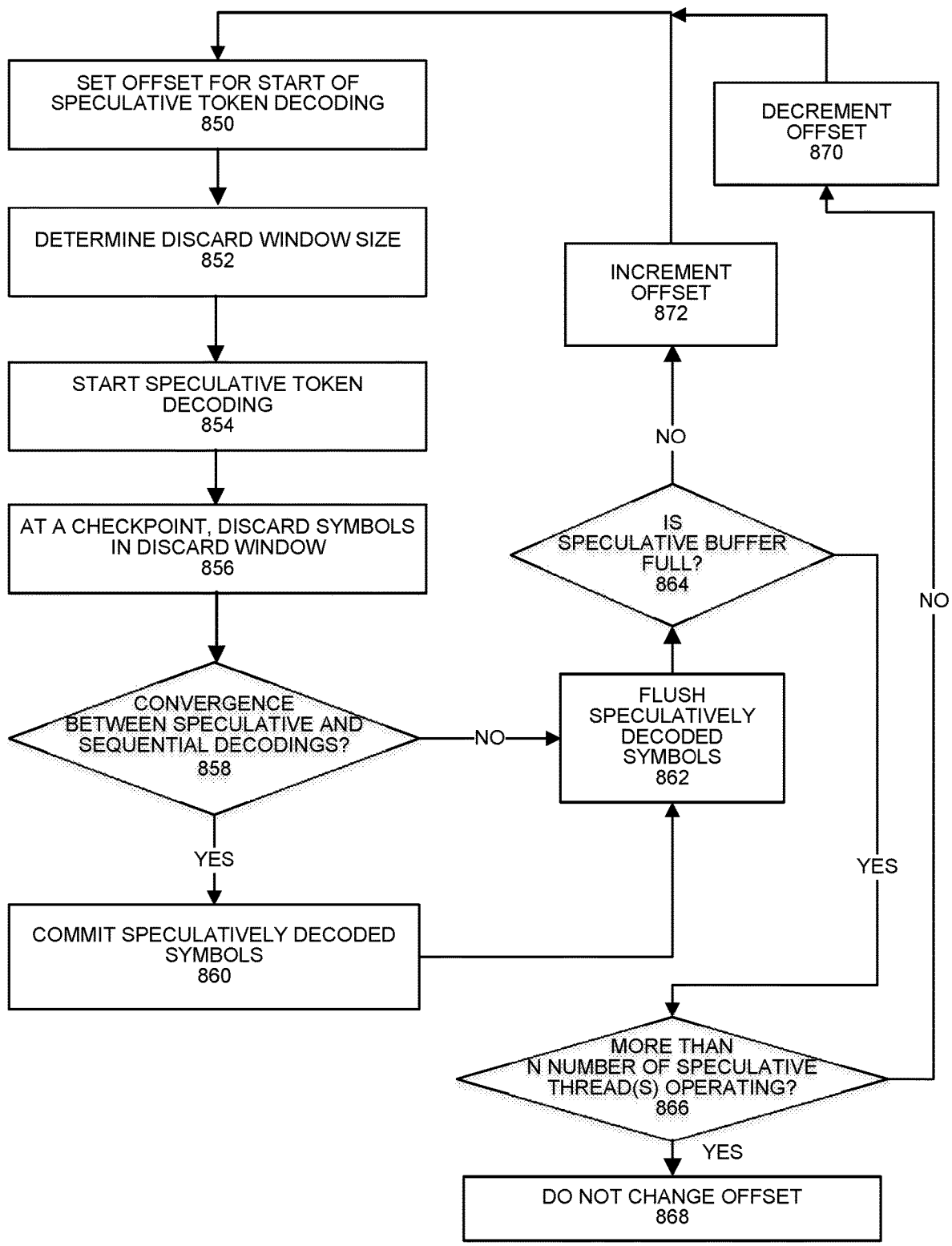
FIG. 8B depicts a process for speculative decompression with adaptive offset and discard window modulation.

FIG. 8B depicts a process for speculative decoding with adaptive offset and discard window modulation. At 850, a token offset can be chosen at which to commence one or more speculative decoding operations. An initial offset value can be a predefined value.

At 852, the discard window size is chosen. A discard window size can be selected based on the offset value. For example, a look-up-table (LUT) or computation can select or determine a discard window size based on the offset value. For example, a relationship as defined in FIG. 6 can be used to select a size of the offset window. A discard window can represent a number of symbols generated from speculatively decoding one or more tokens and that are to be discarded at or after a checkpoint.

At 854, speculative decoding can commence beginning at an offset from a beginning token value decoded by a sequential decoding. For example, the offset can represent a number of tokens after a first token value decoded by a sequential decoding. Symbols generated from speculative decoding can be stored in a speculative buffer in memory or cache.

At 856, at a checkpoint token, symbols in a discard window are discarded. For example, N number of symbols in the discard window generated from decoding one or more tokens using speculative decoding are discarded, where N≥0. For example, if 15 symbols are decoded and the discard window is 10, then the first 10 symbols are discarded. For example, discarding symbols can include flushing or allowing symbols in a speculative buffer to be overwritten.

At 858, a determination is made as to whether there is convergence between speculative and sequential decodings. For example, convergence can occur between speculative and sequential decodings if a beginning (or boundary) of a token decoded using the sequential decoder thread matches a beginning (or boundary) of a token decoded using one or more speculative decoders. A pointer can be used to refer to currently decoded tokens for a sequential decoder and another pointer can be used to refer to currently decoded tokens for a speculative decoder. Convergence can occur when the pointers are the same. If there is convergence, the process continues to 860. But if there is not convergence, the process continues to 862.

At 860, the decoded group of zero or more symbols is committed as a decoded token. The process can continue to 862. At 862, symbols generated from speculative decoding of tokens are flushed from the speculative buffer.

At 864, a determination is made as to whether the speculative buffer is considered full. In some examples, determination of whether the speculative buffer is considered full occurs after discard of symbols in a discard window. Discarded symbols are not considered stored in the buffer and hence do not contribute to the buffer fullness level. In some cases, whether symbols are discarded and then a determination is made of the buffer status (e.g., fullness) or a determination is made of the buffer status (fullness) and then symbols are discarded depends on the implementation. If a buffer pointer (e.g., a FIFO pointer) is used, it will directly indicate if the buffer was considered full even after the data is flushed out. If a buffer pointer is not used, the buffer status can be determined first and then the data flushed out.

For example, a speculative buffer can be considered full if a level of content stored by the buffer meets or exceeds a threshold. If the speculative buffer is not considered full, the process continues to increase an offset value at 872. An amount of increase in the offset value can be programmed. For example, the increase can be in multiples of 10 symbols, where a multiple can be 1 or more. The process continues to 850 using the adjusted offset value.

Increasing offset can increase the chances of convergence. For example, if there are repeated speculation misses (non-convergence), the offset can be increased. However, a limit can be imposed to the size of the offset by a fullness of the buffer. As the offset increases, a time for a token pointer associated with a sequential decoding to catch up and converge with a token pointer associated with speculative decoding increases. A speculative buffer size can be increased to allow for a pointer associated with the sequential decoder to catch up with that or the speculative decoder.

If the speculative buffer is considered full, the process continues to 866. At 866 a determination is made as to whether the more than an integer N number of speculative threads are operating or running concurrent with the sequential (in-order) thread. In some examples, N=1, but other values of N can be used. If more than N number of speculative threads or more are operating or running concurrently with the sequential (in-order) thread, then the process continues to 868, where the offset is not changed. If N number of speculative threads or less than N number of speculative threads are operating or running concurrently with the sequential (in-order) thread, then the process continues to 870, where the offset is reduced. An amount of reduction of the offset value can be programmed. For example, the reduction can be in multiples of 10 symbols, where a multiple can be 1 or more. The process can continue to 850 using the potentially adjusted offset value.

In some examples, at 870, the offset for one or some of the speculative thread(s) can be changed. Depending on the workload, in the case of multiple speculative threads, an offset can be decremented for some (but not all) or all of the speculative threads.

In some examples, if there is not convergence between pointers of sequential and speculative decodings after M number of checkpoints, speculative decoding can be disabled to save power and free memory allocated to speculative buffer.

Figure 9:
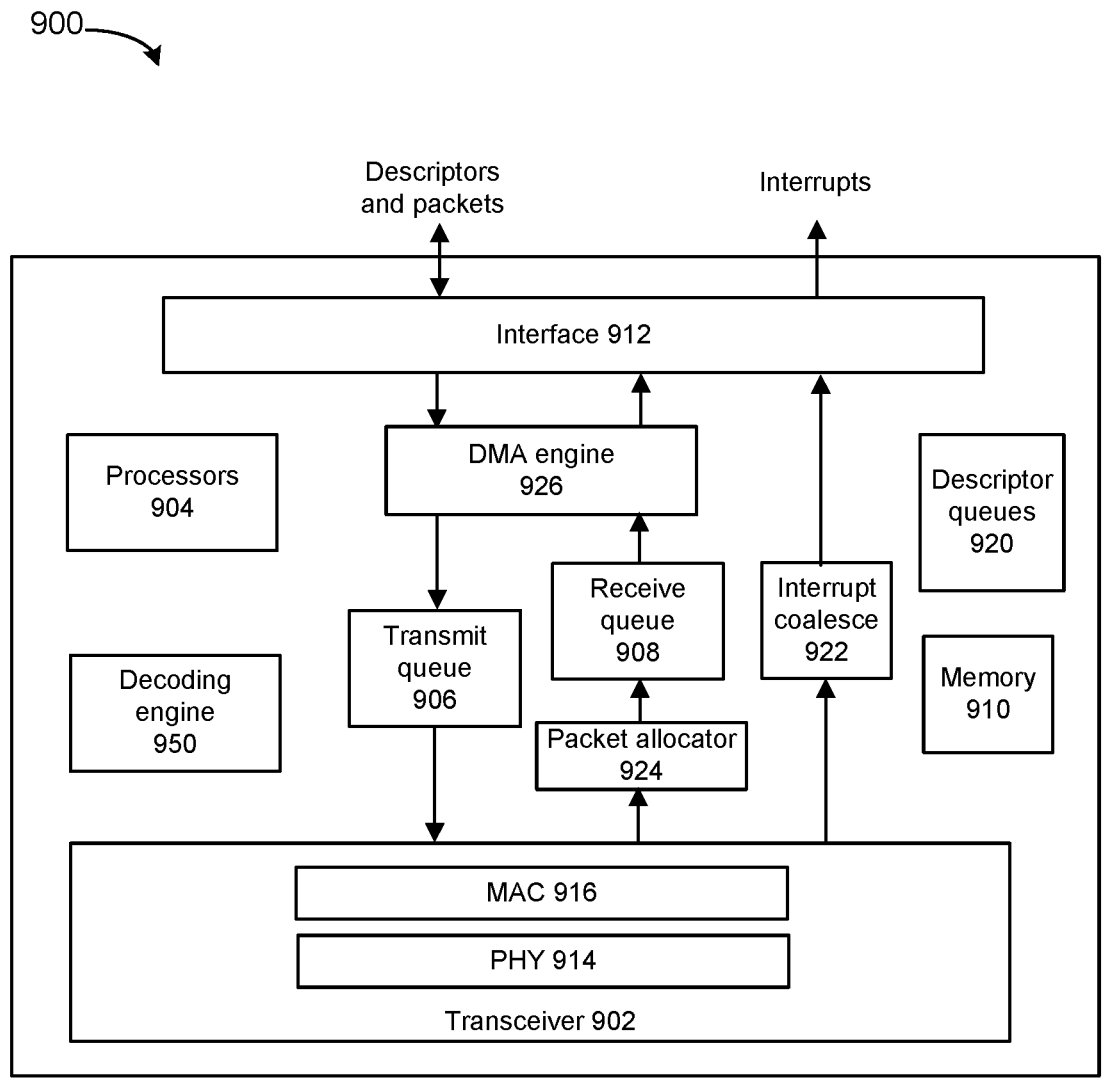
FIG. 9 depicts a network interface that can use embodiments or be used by embodiments.

FIG. 9 depicts a network interface that can use embodiments or be used by embodiments. For example, data received from a network that is encoded, network interface 900 can use a decoder that speculatively decodes one or more groups of tokens. Network interface 900 can include transceiver 902, processors 904, transmit queue 906, receive queue 908, memory 910, and bus interface 912, and DMA engine 926. Transceiver 902 can be capable of receiving and transmitting packets in conformance with the applicable protocols such as Ethernet as described in IEEE 802.3, although other protocols may be used. Transceiver 902 can receive and transmit packets from and to a network via a network medium (not depicted). Transceiver 902 can include physical layer (PHY) circuitry 914 and media access control (MAC) circuitry 916. PHY circuitry 914 can include encoding and decoding circuitry (not shown) to encode and decode data packets according to applicable physical layer specifications or standards. MAC circuitry 916 can be configured to assemble data to be transmitted into packets, that include destination and source addresses along with network control information and error detection hash values. MAC circuitry 916 can be configured to process MAC headers of received packets by verifying data integrity, removing preambles and padding, and providing packet content for processing by higher layers.

Processors 904 can be any a combination of a: processor, core, graphics processing unit (GPU), field programmable gate array (FPGA), application specific integrated circuit (ASIC), or other programmable hardware device that allow programming of network interface 900. For example, processors 904 can provide for allocation or deallocation of intermediate queues. For example, a "smart network interface" can provide packet processing capabilities in the network interface using processors 904.

Packet allocator 924 can provide distribution of received packets for processing by multiple CPUs or cores using timeslot allocation described herein or RSS. When packet allocator 924 uses RSS, packet allocator 924 can calculate a hash or make another determination based on contents of a received packet to determine which CPU or core is to process a packet.

Interrupt coalesce 922 can perform interrupt moderation whereby network interface interrupt coalesce 922 waits for multiple packets to arrive, or for a time-out to expire, before generating an interrupt to host system to process received packet(s). Receive Segment Coalescing (RSC) can be performed by network interface 900 whereby portions of incoming packets are combined into segments of a packet. Network interface 900 provides this coalesced packet to an application.

Direct memory access (DMA) engine 926 can copy a packet header, packet payload, and/or descriptor directly from host memory to the network interface or vice versa, instead of copying the packet to an intermediate buffer at the host and then using another copy operation from the intermediate buffer to the destination buffer.

Memory 910 can be any type of volatile or non-volatile memory device and can store any queue or instructions used to program network interface 900. Transmit queue 906 can include data or references to data for transmission by network interface. Receive queue 908 can include data or references to data that was received by network interface from a network. Descriptor queues 920 can include descriptors that reference data or packets in transmit queue 906 or receive queue 908. Bus interface 912 can provide an interface with host device (not depicted). For example, bus interface 912 can be compatible with peripheral connect Peripheral Component Interconnect (PCI), PCI Express, PCI-x, Serial ATA (SATA), and/or Universal Serial Bus (USB) compatible interface (although other interconnection standards may be used).

Decoding engine 950 can apply in-order or sequential decoding of data received by network interface 900 as well as speculative decoding of data received by network interface 900 where an applied discard window is selected based on a chosen offset between a token position decoded by in-order or sequential decoding and a token position decoded by speculative decoding. The chosen offset can be selected to fill a speculative decoded buffer but not overfill the buffer.

Figure 10:
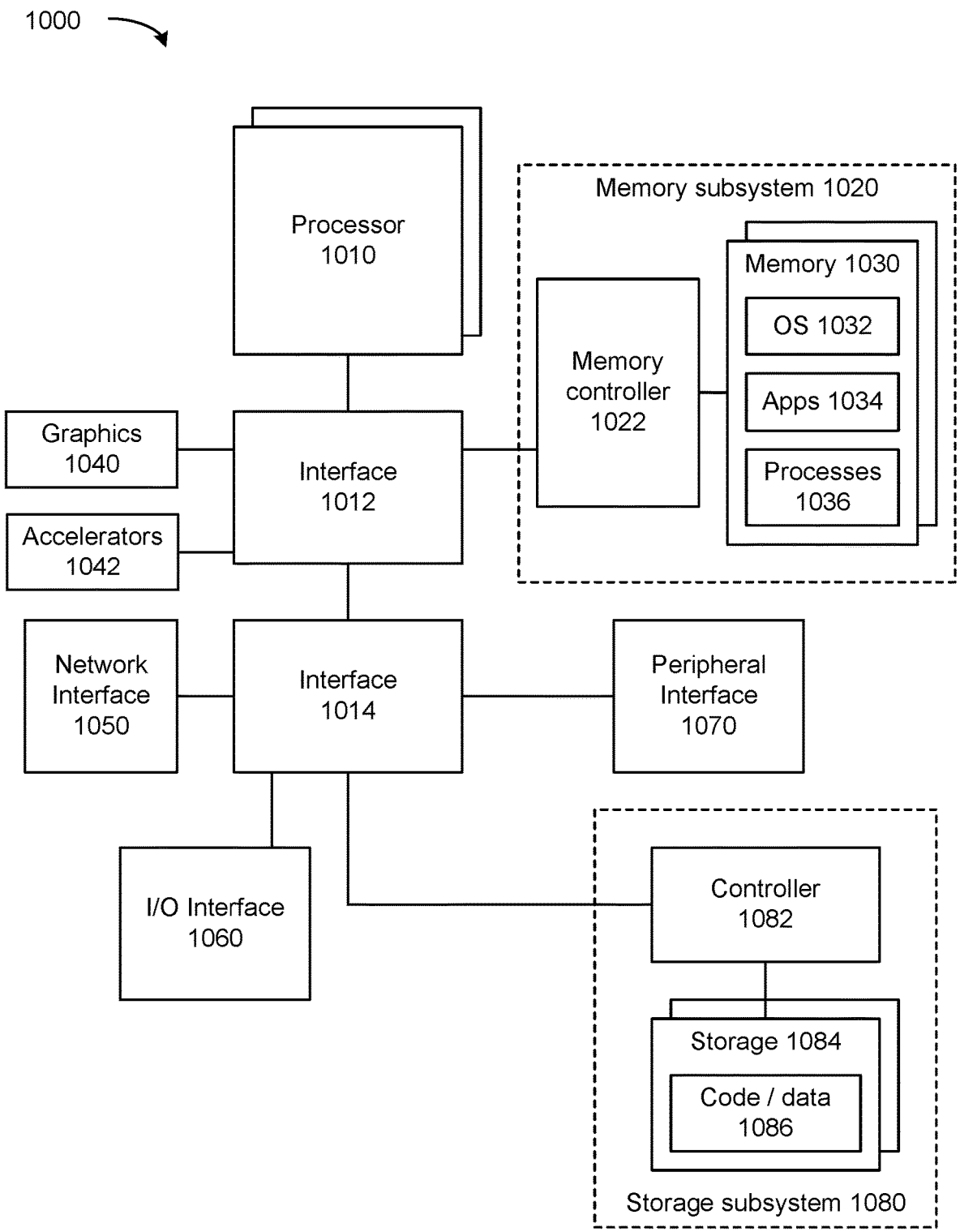
FIG. 10 depicts a system.

FIG. 10 depicts a system. The system can use embodiments described herein to provide data to or from the system to another device through a mesh or fabric. System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 440 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1110 or both. In one example, graphics interface 1040 generates a display based on data stored in memory 1030 or based on operations executed by processor 1010 or both.

Accelerators 1042 can be a fixed function offload engine that can be accessed or used by a processor 1010. For example, an accelerator among accelerators 1042 can provide sequential and speculative decoding operations in a manner described herein, compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 1042 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, one or more varieties of random access memory (RAM) such as DRAM, or other memory devices, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a device that is in the same data center or rack or a remote device, which can include sending data stored in memory. Network interface 1050 can receive data from a remote device, which can include storing received data into memory. Various embodiments can be used in connection with network interface 1050, processor 1010, and memory subsystem 1020.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1046 in a persistent state (i.e., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (i.e., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits or logic in both processor 1010 and interface 1014.

A volatile memory is memory whose state (and therefore the data stored in it) is indeterminate if power is interrupted to the device. Dynamic volatile memory can involve refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WI02 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1000. More specifically, power source typically interfaces to one or multiple power supplies in system 1000 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, a blade includes components common to conventional servers, including a main printed circuit board (main board) providing internal wiring (i.e., buses) for coupling appropriate integrated circuits (ICs) and other components mounted to the board.

Figure 11:
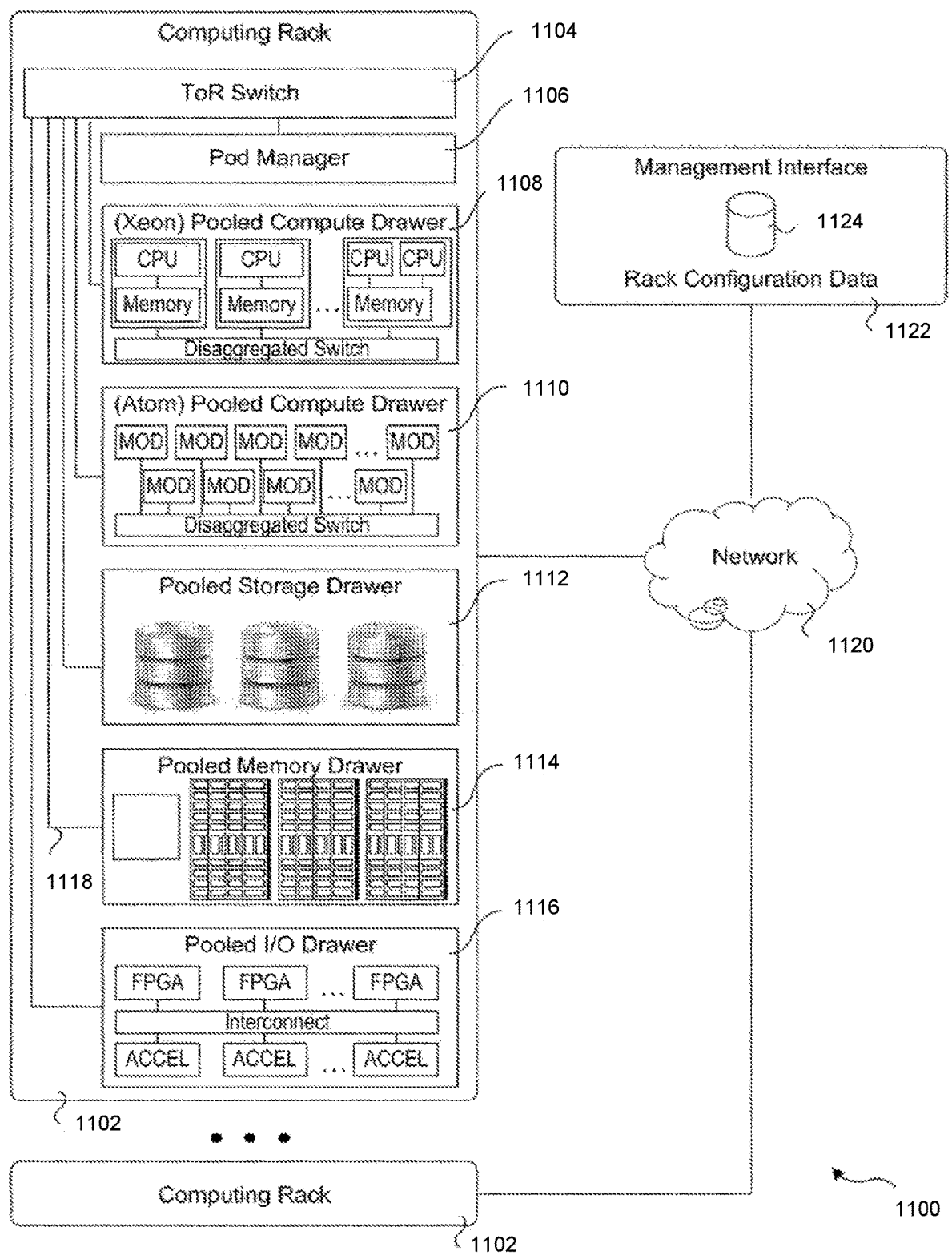
FIG. 11 depicts an example environment.

FIG. 11 depicts an environment 1100 includes multiple computing racks 1102, some including a Top of Rack (ToR) switch 1104, a pod manager 1106, and a plurality of pooled system drawers. Various embodiments can be used in a switch. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 1108, and Intel® ATOM™ pooled compute drawer 1110, a pooled storage drawer 1112, a pooled memory drawer 1114, and a pooled I/O drawer 1116. Some of the pooled system drawers is connected to ToR switch 1104 via a high-speed link 1118, such as a 40 Gigabit/second (Gb/s) or 100 Gb/s Ethernet link or a 100+Gb/s Silicon Photonics (SiPh) optical link. In one embodiment high-speed link 1118 comprises an 800 Gb/s SiPh optical link.

Multiple of the computing racks 1100 may be interconnected via their ToR switches 1104 (e.g., to a pod-level switch or data center switch), as illustrated by connections to a network 1120. In some embodiments, groups of computing racks 1102 are managed as separate pods via pod manager(s) 1106. In one embodiment, a single pod manager is used to manage racks in the pod. Alternatively, distributed pod managers may be used for pod management operations.

Environment 1100 further includes a management interface 1122 that is used to manage various aspects of the environment. This includes managing rack configuration, with corresponding parameters stored as rack configuration data 1124.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry." A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes a data decoder comprising: a memory and at least one processor to: based on a decoding parameter, perform adaptive speculative decode of at least one entropy encoded token relative to a token decoded using a sequential decode and store the at least one speculatively decoded token in a buffer and adjust a decoding parameter based on convergence between sequential decode and speculative decode or content level of the buffer.

Example 2 includes any example, wherein the at least one processor is to adjust a second decoding parameter based on the adjusted decoding parameter.

Example 3 includes any example, wherein the at least one processor is to determine an occurrence of convergence between sequential decode and speculative decode and to determine an occurrence of convergence between sequential decode and speculative decode, the at least one processor is to: at a checkpoint, determine if a start of a token to be decoded using the sequential decode aligns with a token to be decoded using the speculative decode; based on alignment, discard symbols according to the second decoding parameter and commit any non-discarded symbol generated from the speculative decode or based on non-alignment, discard symbols generated from the speculative decode.

Example 4 includes any example, wherein the at least one processor is to adjust a second decoding parameter based on the adjusted decoding parameter, wherein the decoding parameter comprises a level of offset and the second decoding parameter comprises a discard window size.

Example 5 includes any example, wherein the adjust a decoding parameter is to adjust utilization of the buffer.

Example 6 includes any example, wherein the at least one processor is to perform a sequential decode to sequentially decode at least one token.

Example 7 includes any example, wherein the at least one processor is to: perform a second speculative decode to decode one or more tokens based on the adjusted decoding parameter.

Example 8 includes any example, wherein the at least one processor is to adjust a second decoding parameter based on the adjusted decoding parameter and wherein to adjust a second decoding parameter based on the adjusted decoding parameter, the at least one processor is to: access a look-up-table configured to specify a second decoding parameter associated with the adjusted decoding parameter.

Example 9 includes any example, wherein the at least one processor is to adjust a second decoding parameter based on the adjusted decoding parameter and wherein to adjust a second decoding parameter based on the adjusted decoding parameter, the at least one processor is to: perform a computation based on the adjusted decoding parameter to determine the second decoding parameter.

Example 10 includes any example, and including at least two buffers wherein a buffer of the at least two buffers is allocated to store decoded symbols from a first speculative decode and a buffer of the at least two buffers is allocated to store decoded symbols from a second speculative decode and wherein decoding parameters that affect content levels of the at least two buffers are configured based on one or more of convergence between sequential decode and speculative decode or content level of the buffer.

Example 11 includes any example, wherein the at least one processor is used for decode of entropy encoded tokens by one or more of an offload engine, decryption engine, network interface, central processing unit (CPU), or memory controller and wherein the offload engine or decryption engine comprise using one or more of: a Field Programmable Gate Array (FPGA), application specific integrated circuit (ASIC), or other programmable hardware device.

Example 12 includes any example, wherein one or more of an offload engine, decryption engine, network interface, central processing unit (CPU), or memory controller are communicatively coupled to a server, data center, or rack.

Example 13 includes any example, wherein the entropy encoded tokens comprises Huffman encoded tokens.

Example 14 includes a computer-implemented method and comprising: speculatively decoding one or more entropy encoded tokens at an offset from an entropy encoded token decoded by sequentially decoding; determining a content level of a buffer that stores speculatively decoded tokens; and adjusting a decoding parameter based on the content level of the buffer.

Example 15 includes any example and includes adjusting a second decoding parameter based on the adjusted decoding parameter.

Example 16 includes any example an includes: at a checkpoint, determining whether alignment occurs between an entropy encoded token to be decoded by sequentially decoding and an entropy encoded token to be decoded using the speculatively decoding; based on alignment, saving speculatively decoded tokens based on the second decoding parameter; adjusting a token starting point for sequentially decoding to be after the speculatively decoded tokens; and speculatively decoding a token based on the adjusted decoding parameter.

Example 17 includes any example and includes: based on non-alignment, discarding speculatively decoded tokens; continuing sequential decoding for a next available non-decoded token; and speculatively decoding at least one token at the adjusted decoding parameter.

Example 18 includes any example and includes: adjusting a second decoding parameter based on the adjusted decoding parameter and wherein adjusting a second decoding parameter based on the adjusted decoding parameter is based on a look-up-table.

Example 19 includes any example and includes: adjusting a second decoding parameter based on the adjusted decoding parameter and wherein adjusting a second decoding parameter based on the adjusted decoding parameter is based on a calculation of the second decoding parameter based on the adjusted decoding parameter.

Example 20 includes any example, wherein the token comprises a token encoded using Huffman encoding.

Example 21 includes a system including: a memory; a network interface; at least one processor communicatively coupled to the memory and the network interface, wherein the at least one processor is to: speculatively decode at least one token starting at an offset from an entropy encoded token decoded in sequential order; store speculatively decoded tokens in a buffer in the memory; at a checkpoint, determine whether alignment occurs between an entropy encoded token to be decoded by the decode in sequential order and an entropy encoded token to be decoded by the speculatively decode; and adjust a decoding parameter based on alignment or content level of the buffer.

Example 22 includes any example, wherein the at least one processor is to adjust a second decoding parameter based on the adjusted decoding parameter.

Example 23 includes any example, wherein the at least one processor is to determine an occurrence of convergence between sequential decode and speculative decode and to determine an occurrence of convergence between sequential decode and speculative decode, the at least one processor is to: at a checkpoint, determine if a start of a token to be decoded using the sequential decode aligns with a token to be decoded using the speculative decode; based on alignment, discard symbols according to the second decoding parameter and commit any non-discarded symbol generated from the speculative decode or based on non-alignment, discard symbols generated from the speculative decode.

Example 24 includes any example, and includes a second network interface to provide an entropy encoded token to the network interface.

Example 25 includes a computer-readable medium comprising instructions stored thereon, that if executed by a processor, cause the processor to: speculatively decode at least one token starting at an offset from an entropy encoded token decoded in sequential order; store speculatively decoded tokens in a buffer; at a checkpoint, determine whether alignment occurs between an entropy encoded token to be decoded by the decode in sequential order and an entropy encoded token to be decoded by the speculatively decode; adjust a decoding parameter based on alignment or content level of the buffer; and adjust a second decoding parameter based on the adjusted decoding parameter using a look-up-table.

What is claimed is:

1. A data decoder comprising:
   a memory and
   at least one processor to:
      based on a decoding parameter, perform adaptive speculative decode of at least one entropy encoded token relative to a token decoded using a sequential decode and store the at least one speculatively decoded token in a buffer and
      adjust a decoding parameter based on convergence between sequential decode and speculative decode or content level of the buffer.

2. The data decoder of claim 1, wherein the at least one processor is to adjust a second decoding parameter based on the adjusted decoding parameter.

3. The data decoder of claim 2, wherein the at least one processor is to determine an occurrence of convergence between a sequential decode and a speculative decode and to determine an occurrence of convergence between a sequential decode and a speculative decode, the at least one processor is to:
   at a checkpoint, determine if a start of a token to be decoded using the sequential decode aligns with a token to be decoded using the speculative decode;
   based on alignment, discard symbols according to the second decoding parameter and commit any non-discarded symbol generated from the speculative decode or
   based on non-alignment, discard symbols generated from the speculative decode.

4. The data decoder of claim 1, wherein the at least one processor is to adjust a second decoding parameter based on the adjusted decoding parameter, wherein the decoding parameter comprises a level of offset and the second decoding parameter comprises a discard window size.

5. The data decoder of claim 1, wherein the adjust a decoding parameter is to adjust utilization of the buffer.

6. The data decoder of claim 1, wherein the at least one processor is to perform a sequential decode to sequentially decode at least one token.

7. The data decoder of claim 1, wherein the at least one processor is to:
perform a second speculative decode to decode one or more tokens based on the adjusted decoding parameter.

8. The data decoder of claim 1, wherein the at least one processor is to adjust a second decoding parameter based on the adjusted decoding parameter and wherein to adjust a second decoding parameter based on the adjusted decoding parameter, the at least one processor is to:
access a look-up-table configured to specify a second decoding parameter associated with the adjusted decoding parameter.

9. The data decoder of claim 1, wherein the at least one processor is to adjust a second decoding parameter based on the adjusted decoding parameter and wherein to adjust a second decoding parameter based on the adjusted decoding parameter, the at least one processor is to:
perform a computation based on the adjusted decoding parameter to determine the second decoding parameter.

10. The data decoder of claim 1, comprising at least two buffers wherein a buffer of the at least two buffers is allocated to store decoded symbols from a first speculative decode and a buffer of the at least two buffers is allocated to store decoded symbols from a second speculative decode and wherein decoding parameters that affect content levels of the at least two buffers are configured based on one or more of convergence between sequential decode and speculative decode or content level of the buffer.

11. The data decoder of claim 1, wherein the at least one processor is used for decode of entropy encoded tokens by one or more of an offload engine, decryption engine, network interface, central processing unit (CPU), or memory controller and wherein the offload engine or decryption engine comprise using one or more of: a Field Programmable Gate Array (FPGA), application specific integrated circuit (ASIC), or other programmable hardware device.

12. The data decoder of claim 11, wherein one or more of an offload engine, decryption engine, network interface, central processing unit (CPU), or memory controller are communicatively coupled to a server, data center, or rack.

13. The data decoder of claim 1, wherein the at least one entropy encoded token comprises Huffman encoded tokens.

14. A computer-implemented method comprising:
speculatively decoding one or more entropy encoded tokens at an offset from an entropy encoded token decoded by sequentially decoding;
determining a content level of a buffer that stores speculatively decoded tokens; and
adjusting a decoding parameter based on the content level of the buffer.

15. The method of claim 14, comprising adjusting a second decoding parameter based on the adjusted decoding parameter.

16. The method of claim 15, comprising:
at a checkpoint, determining whether alignment occurs between an entropy encoded token to be decoded by sequentially decoding and an entropy encoded token to be decoded using the speculatively decoding;
based on alignment, saving speculatively decoded tokens based on the second decoding parameter;
adjusting a token starting point for sequentially decoding to be after the speculatively decoded tokens; and
speculatively decoding a token based on the adjusted decoding parameter.

17. The method of claim 14, comprising:
based on non-alignment, discarding speculatively decoded tokens;
continuing sequential decoding for a next available non-decoded token; and
speculatively decoding at least one token at the adjusted decoding parameter.

18. The method of claim 14, comprising adjusting a second decoding parameter based on the adjusted decoding parameter and wherein adjusting a second decoding parameter based on the adjusted decoding parameter is based on a look-up-table.

19. The method of claim 14, comprising adjusting a second decoding parameter based on the adjusted decoding parameter and wherein adjusting a second decoding parameter based on the adjusted decoding parameter is based on a calculation of the second decoding parameter based on the adjusted decoding parameter.

20. The method of claim 14, wherein the token comprises a token encoded using Huffman encoding.

21. A system comprising:
a memory;
a network interface;
at least one processor communicatively coupled to the memory and the network interface, wherein the at least one processor is to:
speculatively decode at least one token starting at an offset from an entropy encoded token decoded in sequential order;
store speculatively decoded tokens in a buffer in the memory;
at a checkpoint, determine whether alignment occurs between an entropy encoded token to be decoded by the decode in sequential order and an entropy encoded token to be decoded by the speculatively decode; and
adjust a decoding parameter based on alignment or content level of the buffer.

22. The system of claim 21, wherein the at least one processor is to adjust a second decoding parameter based on the adjusted decoding parameter.

23. The system of claim 22, wherein the at least one processor is to determine an occurrence of convergence between a sequential decode and a speculative decode and to determine an occurrence of convergence between a sequential decode and a speculative decode, the at least one processor is to:
at a checkpoint, determine if a start of a token to be decoded using the sequential decode aligns with a token to be decoded using the speculative decode;
based on alignment, discard symbols according to the second decoding parameter and commit any non-discarded symbol generated from the speculative decode or
based on non-alignment, discard symbols generated from the speculative decode.

24. The system of claim 21, comprising a second network interface to provide an entropy encoded token to the network interface.

25. A non-transitory computer-readable medium comprising instructions stored thereon, that if executed by a processor, cause the processor to:
speculatively decode at least one token starting at an offset from an entropy encoded token decoded in sequential order;
store speculatively decoded tokens in a buffer;
at a checkpoint, determine whether alignment occurs between an entropy encoded token to be decoded by the decode in sequential order and an entropy encoded token to be decoded by the speculatively decode;

adjust a decoding parameter based on alignment or content level of the buffer; and adjust a second decoding parameter based on the adjusted decoding parameter using a look-up-table.

26. The computer-readable medium of claim 25, wherein the decoding parameter comprises a level of offset and the second decoding parameter comprises a discard window size.

* * * * *